United States Patent
Jacobs, II et al.

(10) Patent No.: US 10,235,009 B1
(45) Date of Patent: Mar. 19, 2019

(54) PRODUCT VARIABLE OPTIMIZATION FOR MANUFACTURE OR SUPPLY OF DESIGNED PRODUCTS

(71) Applicant: Desprez, LLC, New London, NH (US)

(72) Inventors: James L. Jacobs, II, Amherst, NH (US); John E. Cronin, Bonita Springs, FL (US); Christopher M. Huffines, Williston, VT (US); Steven M. Lynch, Hudson, NH (US)

( * ) Notice: Subject to any disclaimer, the term of this patent is extended or adjusted under 35 U.S.C. 154(b) by 446 days.

(21) Appl. No.: 14/928,814

(22) Filed: Oct. 30, 2015

Related U.S. Application Data

(60) Provisional application No. 62/073,441, filed on Oct. 31, 2014.

(51) Int. Cl.
| | | |
|---|---|---|
| *G06F 3/048* | (2013.01) | |
| *G06F 3/0481* | (2013.01) | |
| *G06F 3/0484* | (2013.01) | |
| *B33Y 50/02* | (2015.01) | |

(52) U.S. Cl.
CPC ...... *G06F 3/04815* (2013.01); *G06F 3/04842* (2013.01); *B33Y 50/02* (2014.12)

(58) Field of Classification Search
CPC .................................................. G06F 3/048
See application file for complete search history.

(56) References Cited

U.S. PATENT DOCUMENTS

| | | |
|---|---|---|
| 4,495,559 A | 1/1985 | Gelatt, Jr. et al. |
| 5,117,354 A | 5/1992 | Long et al. |
| 5,465,221 A | 11/1995 | Merat et al. |
| 5,495,430 A | 2/1996 | Matsunari et al. |
| 5,552,995 A | 9/1996 | Sebastian |
| 5,570,291 A | 10/1996 | Dudle et al. |
| 5,655,087 A | 8/1997 | Hino et al. |
| 5,758,328 A | 5/1998 | Giovannoli |
| 5,847,971 A | 12/1998 | Ladner et al. |
| 5,870,719 A | 2/1999 | Maritzen et al. |
| 5,937,189 A | 8/1999 | Branson et al. |
| 6,031,535 A | 2/2000 | Barton |

(Continued)

FOREIGN PATENT DOCUMENTS

| | | |
|---|---|---|
| WO | 154476 A2 | 8/2001 |
| WO | 171626 A2 | 9/2001 |

(Continued)

OTHER PUBLICATIONS

Defining Lead Time for APS Planning; http://t3.apptrix.com/syteline/Language/en-US/Other/Process/Defining_Lead_Time.htm.

(Continued)

*Primary Examiner* — Xuyang Xia
(74) *Attorney, Agent, or Firm* — Caldwell Intellectual Property Law

(57) ABSTRACT

A method carried out on a computer system for receiving information corresponding to a plurality of variables that can be applied to the manufacture of a designed product. When a user selects from a menu of first attributes, related ones of a second set of attributes are presented for selection. In an embodiment, the set of possible manufacturing attributes is initially compared to attributes of the designed product to eliminate from consideration those manufacturing attributes that are not compatible with the attributes of the product.

20 Claims, 9 Drawing Sheets

(56) References Cited

U.S. PATENT DOCUMENTS

| | | |
|---|---|---|
| 6,112,133 A | 8/2000 | Fishman |
| 6,295,513 B1 | 9/2001 | Thackston |
| 6,341,271 B1 | 1/2002 | Salvo et al. |
| 6,343,285 B1 | 1/2002 | Tanaka et al. |
| 6,611,725 B1 | 8/2003 | Harrison |
| 6,647,373 B1 | 11/2003 | Carlton-Foss |
| 6,701,200 B1 | 3/2004 | Lukis et al. |
| 6,750,864 B1 | 6/2004 | Anwar |
| 6,834,312 B2 | 12/2004 | Edwards et al. |
| 6,836,699 B2 | 12/2004 | Lukis et al. |
| 6,859,768 B1 | 2/2005 | Wakelam et al. |
| 6,922,701 B1 | 6/2005 | Ananian et al. |
| 6,917,847 B2 | 7/2005 | Littlejohn et al. |
| 7,006,084 B1 | 2/2006 | Buss et al. |
| 7,058,465 B2 | 6/2006 | Emori et al. |
| 7,079,990 B2 | 7/2006 | Haller et al. |
| 7,085,687 B2 | 8/2006 | Eckenwiler et al. |
| 7,089,082 B1 | 8/2006 | Lukis et al. |
| 7,123,986 B2 | 10/2006 | Lukis et al. |
| 7,134,096 B2 | 11/2006 | Brathwaite et al. |
| 7,299,101 B2 | 11/2007 | Lukis et al. |
| 7,305,367 B1 | 12/2007 | Hollis et al. |
| 7,327,869 B2 | 2/2008 | Boyer |
| 7,343,212 B1 | 3/2008 | Brearley et al. |
| 7,359,886 B2 | 4/2008 | Sakurai et al. |
| 7,366,643 B2 | 4/2008 | Verdura et al. |
| 7,369,970 B2 | 5/2008 | Shimizu et al. |
| 7,418,307 B2 | 8/2008 | Katircioglu |
| 7,467,074 B2 | 12/2008 | Faruque et al. |
| 7,496,487 B2 | 2/2009 | Wakelam et al. |
| 7,496,528 B2 | 2/2009 | Lukis et al. |
| 7,499,871 B1 | 3/2009 | McBrayer et al. |
| 7,523,411 B2 | 4/2009 | Carlin |
| 7,526,358 B2 | 4/2009 | Kawano et al. |
| 7,529,650 B2 | 5/2009 | Wakelam et al. |
| 7,565,139 B2 | 7/2009 | Neven, Sr. et al. |
| 7,565,223 B2 | 7/2009 | Moldenhauer et al. |
| 7,567,849 B1 | 7/2009 | Trammell et al. |
| 7,568,155 B1 | 7/2009 | Axe et al. |
| 7,571,166 B1 | 8/2009 | Davies et al. |
| 7,574,339 B1 | 8/2009 | Lukis et al. |
| 7,590,466 B2 | 9/2009 | Lukis et al. |
| 7,590,565 B2 | 9/2009 | Ward et al. |
| 7,603,191 B2 | 10/2009 | Gross |
| 7,606,628 B2 | 10/2009 | Azuma |
| 7,630,783 B2 | 12/2009 | Walls-Manning et al. |
| 7,656,402 B2 | 2/2010 | Abraham et al. |
| 7,689,936 B2 | 3/2010 | Rosel |
| 7,733,339 B2 | 6/2010 | Laning et al. |
| 7,747,469 B2 | 6/2010 | Hinman |
| 7,748,622 B2 | 7/2010 | Schon et al. |
| 7,761,319 B2 | 7/2010 | Gil et al. |
| 7,822,682 B2 | 10/2010 | Arnold et al. |
| 7,836,573 B2 | 11/2010 | Lukis et al. |
| 7,840,443 B2 | 11/2010 | Lukis et al. |
| 7,908,200 B2 | 3/2011 | Scott et al. |
| 7,957,830 B2 | 6/2011 | Lukis et al. |
| 7,979,313 B1 | 7/2011 | Baar |
| 7,993,140 B2 | 8/2011 | Sakezles |
| 8,000,987 B2 | 8/2011 | Hickey et al. |
| 8,024,207 B2 | 9/2011 | Ouimet |
| 8,140,401 B2 | 3/2012 | Lukis et al. |
| 8,170,946 B2 | 5/2012 | Blair et al. |
| 8,175,933 B2 | 5/2012 | Cook, Jr. et al. |
| 8,180,396 B2 | 5/2012 | Athsani et al. |
| 8,209,327 B2 | 6/2012 | Danish et al. |
| 8,239,284 B2 | 8/2012 | Lukis et al. |
| 8,249,329 B2 | 8/2012 | Silver |
| 8,271,118 B2 | 9/2012 | Pietsch et al. |
| 8,275,583 B2 | 9/2012 | Devarajan et al. |
| 8,295,971 B2 | 10/2012 | Krantz |
| 8,417,478 B2 | 4/2013 | Gintis et al. |
| 8,441,502 B2 | 5/2013 | Reghetti et al. |
| 8,515,820 B2 | 8/2013 | Lopez et al. |
| 8,554,250 B2 | 10/2013 | Linaker |
| 8,571,298 B2 | 10/2013 | McQueen et al. |
| 8,595,171 B2 | 11/2013 | Qu |
| 8,700,185 B2 | 4/2014 | Yucel et al. |
| 8,706,607 B2 | 4/2014 | Sheth et al. |
| 8,768,651 B2 | 7/2014 | Bhaskaran et al. |
| 8,798,324 B2 | 8/2014 | Conradt |
| 8,806,398 B2 | 8/2014 | Brathwaite et al. |
| 8,830,267 B2 | 9/2014 | Brackney |
| 8,849,636 B2 | 9/2014 | Becker et al. |
| 8,861,005 B2 | 10/2014 | Grosz |
| 8,874,413 B2 | 10/2014 | Mulligan et al. |
| 8,923,650 B2 | 12/2014 | Wexler |
| 8,977,558 B2 | 3/2015 | Nielsen et al. |
| 9,037,692 B2 | 5/2015 | Ferris |
| 9,055,120 B1 | 6/2015 | Firman |
| 9,106,764 B2 | 8/2015 | Chan et al. |
| 2001/0023418 A1 | 9/2001 | Suzuki et al. |
| 2001/0047251 A1 | 11/2001 | Kemp |
| 2002/0065790 A1 | 5/2002 | Oouchi |
| 2002/0087440 A1 | 7/2002 | Blair et al. |
| 2002/0099579 A1 | 7/2002 | Stowell et al. |
| 2002/0107673 A1 | 8/2002 | Haller et al. |
| 2002/0152133 A1 | 10/2002 | King et al. |
| 2003/0018490 A1 | 1/2003 | Magers et al. |
| 2003/0069824 A1 | 4/2003 | Menninger |
| 2003/0078846 A1 | 4/2003 | Burk et al. |
| 2003/0139995 A1 | 7/2003 | Farley |
| 2003/0149500 A1 | 8/2003 | Faruque et al. |
| 2003/0163212 A1 | 8/2003 | Smith et al. |
| 2003/0172008 A1 | 9/2003 | Hage et al. |
| 2003/0212610 A1 | 11/2003 | Duffy et al. |
| 2003/0220911 A1 | 11/2003 | Tompras et al. |
| 2004/0008876 A1 | 1/2004 | Lure et al. |
| 2004/0113945 A1 | 6/2004 | Park et al. |
| 2004/0186759 A1* | 9/2004 | Fukui ............... G05B 19/4097 |
| | | 705/7.11 |
| 2004/0195224 A1 | 10/2004 | Kanodia et al. |
| 2005/0055299 A1 | 3/2005 | Chambers et al. |
| 2005/0125092 A1 | 6/2005 | Lukis et al. |
| 2005/0144033 A1 | 6/2005 | Vreeke et al. |
| 2005/0171790 A1 | 8/2005 | Blackmon |
| 2005/0251478 A1 | 11/2005 | Yanavi |
| 2005/0273401 A1 | 12/2005 | Yeh et al. |
| 2006/0085322 A1 | 4/2006 | Crookshanks |
| 2006/0185275 A1 | 8/2006 | Yatt |
| 2006/0253214 A1 | 11/2006 | Gross |
| 2007/0016437 A1 | 1/2007 | Elmufdi et al. |
| 2007/0067146 A1 | 3/2007 | Devarajan et al. |
| 2007/0073593 A1 | 5/2007 | Perry et al. |
| 2007/0112635 A1 | 5/2007 | Loncaric |
| 2007/0198231 A1 | 8/2007 | Walch |
| 2008/0120086 A1 | 5/2008 | Lilley et al. |
| 2008/0183614 A1 | 7/2008 | Gujral et al. |
| 2008/0269942 A1 | 10/2008 | Free |
| 2008/0281678 A1 | 11/2008 | Keuls et al. |
| 2009/0058860 A1 | 3/2009 | Fong et al. |
| 2009/0208773 A1 | 8/2009 | DuPont |
| 2009/0299799 A1 | 12/2009 | Racho et al. |
| 2009/0319388 A1 | 12/2009 | Yuan et al. |
| 2011/0040542 A1 | 2/2011 | Sendhoff et al. |
| 2011/0047140 A1 | 2/2011 | Free |
| 2011/0209081 A1 | 8/2011 | Chen et al. |
| 2011/0213757 A1 | 9/2011 | Bhaskaran et al. |
| 2012/0016678 A1 | 1/2012 | Gruber et al. |
| 2012/0072299 A1 | 3/2012 | Sampsell |
| 2012/0124492 A1* | 5/2012 | Taron ................. G06F 9/4443 |
| | | 715/762 |
| 2012/0230548 A1 | 9/2012 | Calman et al. |
| 2012/0316667 A1 | 12/2012 | Hartloff |
| 2013/0055126 A1 | 2/2013 | Jackson |
| 2013/0097259 A1 | 4/2013 | Li |
| 2013/0100128 A1 | 4/2013 | Steedly et al. |
| 2013/0138529 A1 | 5/2013 | Hou |
| 2013/0144566 A1 | 6/2013 | De Biswas |
| 2013/0166470 A1 | 6/2013 | Grala et al. |
| 2013/0218961 A1 | 8/2013 | Ho |
| 2013/0293580 A1 | 11/2013 | Spivack |
| 2013/0297320 A1 | 11/2013 | Buser |
| 2013/0297460 A1 | 11/2013 | Spivack |

(56) References Cited

U.S. PATENT DOCUMENTS

| | | | |
|---|---|---|---|
| 2013/0311914 | A1 | 11/2013 | Daily |
| 2013/0325410 | A1 | 12/2013 | Jung et al. |
| 2014/0042136 | A1 | 2/2014 | Daniel et al. |
| 2014/0067333 | A1 | 3/2014 | Rodney et al. |
| 2014/0075342 | A1 | 3/2014 | Corlett |
| 2014/0098094 | A1 | 4/2014 | Neumann et al. |
| 2014/0157579 | A1 | 6/2014 | Chhabra et al. |
| 2014/0207605 | A1 | 7/2014 | Allin et al. |
| 2014/0229316 | A1 | 8/2014 | Brandon |
| 2014/0279177 | A1 | 9/2014 | Stump |
| 2014/0379119 | A1 | 12/2014 | Sciacchitano et al. |
| 2015/0055085 | A1 | 2/2015 | Fonte et al. |
| 2015/0066189 | A1 | 3/2015 | Mulligan et al. |
| 2015/0127480 | A1 | 5/2015 | Herrman et al. |
| 2015/0234377 | A1* | 8/2015 | Mizikovsky ........ G06F 17/5004 700/98 |

FOREIGN PATENT DOCUMENTS

| | | | |
|---|---|---|---|
| WO | 2001077781 | A2 | 10/2001 |
| WO | 2006086332 | A2 | 8/2006 |
| WO | 2007067248 | A2 | 6/2007 |
| WO | 2011139630 | A1 | 11/2011 |
| WO | 2011140646 | | 11/2011 |
| WO | 2013058764 | A1 | 4/2013 |
| WO | 2014152396 | A2 | 9/2014 |

OTHER PUBLICATIONS

"Quartiles." Mathisfun.com. Web. <https://www.mathsisfun.com/data/quartiles.html>. Archive. <https://web.archive.org/web/20100909011751/http://www.mathsisfun.com/data/quartiles.html>.
Wu et al. Interactive 3D Geometric Modelers with 2D UI, 2002, State University of Campinas, www.dca.fee.unicamp.br, Sao Paulo, Brazil; 2002, 8 pages.
"Upload Your Photos, Print a 3D Model with hypr3D." SolidSmack. http://www.solidsmack.com/cad-design-news/hypr3d-photo-video-3d-print/; last accessed on Oct. 13, 2015.
"123D Catch." Autodesk. http://apps.123dapp.com/catch/.
Rothganger et al. "3D Object Modeling and Recognition from Photographs and Image Sequences." Toward Category-Level Object Recognition. 2006, pp. 105-126, vol. 4170 of the series Lecture Notes in Computer Science. Springer Berlin Heidelberg.
Dealer Information Systems Corporation. "Parts Inventory." http://dis-corp.com/content/agriculture/inventory/parts-inventory.
EMachineShop. "Emachineshop Features." http://www.emachineshop.com/machine-shop/Features/page518.html.
Retrieved from:http://www.solidworks.com/sw/products/3d-cad/manufacturing-cost-estimation-quoting.htm p. 1: Automatic Manufacturing Cost Estimation Overview; Solidworks; 2015.
Retrieved from: http://www.gom.com/fileadmin/user_upload/industries/touch_probe_fixtures_EN.pdf; Application Example: Quality Control, Online Calibration and Validation of Fixtures, Jigs and Gauges. GOM mbH, 2008.
http://citeseerx.ist.psu.edu/viewdoc/download?doi=10.1.1.194.7785&rep=rep1&type=pdf Kim, Jin Baek, and Arie Segev. "A web services-enabled marketplace architecture for negotiation process management." Decision Support Systems 40.1 (2005): 71-87.

Jaiswal, Ashutosh et al., "Design and Implementation of a Secure Multi-Agent Marketplace", Elsevier Science, pp. 1-23, Jun. 3, 2004; http://magnet.cs.umn.edu/papers/Jaiswal04cera.pdf.
http://www.computer.org/csdl/proceedings/hicss/2005/2268/01/22680038.pdf Bui, Tung, and Alexandre Gachet. "Web services for negotiation and bargaining in electronic markets: Design requirements and implementation framework." System Sciences, 2005. HICSS'05.
http://www.bridgelinedigital.com/File%20Library/Repository/eCommerce/Sample-eCommerce-RFP-Template_Bridgeline-Digital.pdf. Sample RFP Template: Ecommerce Platform, Bridgeline Digital, 2014.
Matchbook, Tealbook, http://www.matchbookinc.com/ Sep. 28, 2015.
3Diligent, Source Smarter, http://www.3diligent.com/customer.html; Sep. 28, 2015.
Dassault Systemes, Brochure, Mar. 24, 2010: New Features Type3ToCatia http://www.type3.us/content/download/2202/405535/file/New%20Feature_Type3ToCatia_2010_US%20old.pdf.
Xue, S., X. Y. Kou, and S. T. Tan. "Natural voice-enabled CAD: modeling via natural discourse." Computer-Aided Design and Applications 6.1 (2009): 125-136.
Kou, X. Y., S. K. Xue, and S. T. Tan. "Knowledge-guided inference for voice-enabled CAD." Computer-Aided Design 42.6 (2010): 545-557.
Sharma, Anirudh, et al. "MozArt: a multimodal interface for conceptual 3D modeling." Proceedings of the 13th international conference on multimodal interfaces. ACM, 2011.
Sorpas ("User Manual,", Swanted Software and Engineering Aps, 2011 (120 pages)).
U.S. Appl. No. 14/267,447, Aug. 5, 2015, Office Action.
U.S. Appl. No. 14/197,922, Nov. 26, 2014, Office Action.
U.S. Appl. No. 14/197,922, Apr. 27, 2015, Response to Office Action.
U.S. Appl. No. 14/197,922, May 15, 2015, Office Action.
U.S. Appl. No. 14/267,447, Jun. 18, 2015, Response to Office Action.
U.S. Appl. No. 14/263,665, Oct. 8, 2015, Office Action.
U.S. Appl. No. 14/053,222, Jan. 29, 2016, Office Action.
U.S. Appl. No. 14/311,943, Apr. 27, 2016, Office Action.
U.S. Appl. No. 14/486,550, May 26, 2016, Office Action.
U.S. Appl. No. 14/060,033, Jun. 15, 2016, Office Action.
U.S. Appl. No. 14/172,462, Jul. 6, 2016, Office Action.
U.S. Appl. No. 14/053,222, Jul. 29, 2016, Response to Office Action.
U.S. Appl. No. 14/185,204, Jul. 29, 2016, Office Action.
U.S. Appl. No. 14/062,947, Sep. 16, 2016, Office Action.
U.S. Appl. No. 14/060,033, filed Oct. 22, 2013.
U.S. Appl. No. 14/053,222, filed Oct. 14, 2013.
U.S. Appl. No. 14/172,462, filed Oct. 16, 2013.
U.S. Appl. No. 14/062,947, filed Oct. 25, 2013.
U.S. Appl. No. 14/172,404, filed Feb. 4, 2014.
U.S. Appl. No. 14/303,372, filed Jun. 12, 2014.
U.S. Appl. No. 14/185,204, filed Feb. 20, 2014.
U.S. Appl. No. 14/195,391, filed Mar. 3, 2014.
U.S. Appl. No. 14/246,254, filed Apr. 7, 2014.
U.S. Appl. No. 14/229,008, filed Mar. 28, 2014.
U.S. Appl. No. 14/197,922, filed Mar. 5, 2014.
U.S. Appl. No. 14/263,665, filed Apr. 28, 2014.
U.S. Appl. No. 14/267,447, filed May 1, 2014.
U.S. Appl. No. 14/311,943, filed Jun. 23, 2014.

* cited by examiner

Characteristic Database 240:

| Process 302 | Material 304 | Tolerance (inch) 702 | Maximum Units 704 | Minimum 3D Size (inch) 706 | Maximum 3D Size (inch) 708 | Minimum Flat Size (inch) 710 | Maximum Flat Size (inch) 712 | Minimum Thickness (inch) 714 | Maximum Thickness (inch) 716 |
|---|---|---|---|---|---|---|---|---|---|
| Laser Cutting 720 | Aluminum 6061-T6 | +/- 0.002 | 750 | 0.002x0.1x0.1 | 0.02x48.0x48.0 | 0.1x0.1 | 48.0x48.0 | 0.002 | 0.02 |
| Chemical Etching 722A | Aluminum 5052-H32 | +/- 0.002 | 2k | 0.002x0.1x0.1 | 0.02x6.0x24.0 | 0.1x0.1 | 6.0x24.0 | 0.002 | 0.02 |
| Chemical Etching | Aluminum 6061-T6 | +/- 0.002 | 2k | 0.002x0.1x0.1 | 0.02x6.0x24.0 | 0.1x0.1 | 6.0x24.0 | 0.002 | 0.02 |
| WaterJet Cutting 722B | Aluminum 5052-H32 | +/- 0.010 | 3k | 0.125x1.0x1.0 | 3.0x48.0x48.0 | 1.0x1.0 | 48.0x48.0 | 0.125 | 3 |
| WaterJet Cutting | Aluminum 6061-T6 | +/- 0.010 | 3k | 0.125x1.0x1.0 | 3.0x48.0x48.0 | 1.0x1.0 | 48.0x48.0 | 0.125 | 3 |
| WaterJet Cutting | Polycarbonate | +/- 0.010 | 2k | 0.125x1.0x1.0 | 3.0x48.0x48.0 | 1.0x1.0 | 48.0x48.0 | 0.125 | 3 |
| WaterJet Cutting | Acetal | +/- 0.010 | 2k | 0.125x1.0x1.0 | 3.0x48.0x48.0 | 1.0x1.0 | 48.0x48.0 | 0.125 | 3 |
| Injection Molding | Polycarbonate | +/- 0.005 | 1k | 0.25x0.25x0.25 | 6.0x12.0x18.0 | x | x | 0.05 | 0.11 |
| Injection Molding | Acetal | +/- 0.005 | 1k | 0.25x0.25x0.25 | 6.0x12.0x18.0 | x | x | 0.05 | 0.11 |

FIG. 7

PRODUCT VARIABLE OPTIMIZATION FOR MANUFACTURE OR SUPPLY OF DESIGNED PRODUCTS

RELATED APPLICATION DATA

This application claims the benefit of priority of U.S. Provisional Patent Application Ser. No. 62/073,441, filed on Oct. 31, 2014, and titled "PRODUCT VARIABLE OPTIMIZATION FOR MANUFACTURE OR SUPPLY OF DESIGNED PRODUCTS," which is incorporated by reference herein in its entirety.

FIELD OF THE INVENTION

The present invention generally relates to the field of manufacture of machine-designed products, and in particular to the optimization of product/process variables related to manufacture or supply of such products.

BACKGROUND

Computer-aided design (CAD) programs are typically utilized to create, model, and optimize the design an product or article for subsequent manufacture, often by modeling a 3D representation of the designed product. CAD programs typically include a user interface for enabling a user to input design requirements, constraints, required performance criteria, testing criteria, and required elements or materials. While a product is designed, designers and engineers need to consider how it will be manufactured. If the design was made specifically for a particular manufacturer, in the case such as an in-house manufacturer, then amongst the constraints imposed on the product design are those that arise from the available capacity and other attributes of the specific manufacturer in question. Typically, after a product is designed, the manufacturer conducts an initial design review in which the design is compared against the process, material, and other product-related and production-related capabilities of the manufacturer. This review introduces delays and inefficiencies. If there is a mismatch between the capabilities of the manufacturer and the requirements of the design, the designer either has to re-design the product to meet the capabilities of the manufacturer or seek out a new manufacturer.

SUMMARY OF THE DISCLOSURE

In one implementation, the present disclosure is directed to a method of assisting a user with specifying product attributes for a structure defined in a 3D computer model via a computer-implemented user interface. The method performed by one or more computing devices includes presenting to the user, via the user interface, a plurality of first product variable attributes; automatedly interrogating the 3D computer model, via the one or more computing devices, to identify one or more aspects of the structure; receiving a selection of at least one of the plurality of first product variable attributes from a user via the user interface; in response to the user's selection of at least one of the plurality of first product variable attributes, determining, via the one or more computing devices, one or more second product variable attributes that are compatible with the selected at least one of the plurality of first product variable attributes and the at least one of the one or more aspects of the structure identified by the interrogating; and indicating to the user, via the user interface, the one or more second product variable attributes.

In another implementation, the present disclosure is directed to a machine-readable storage medium containing machine-executable instructions for performing method of assisting a user with specifying product attributes for a structure defined in a 3D computer model via a computer-implemented user interface. The machine-executable instructions include a first set of machine-executable instructions for presenting to the user, via the user interface, a plurality of first product variable attributes; a second set of machine-executable instructions for automatedly interrogating the 3D computer model, via the one or more computing devices, to identify one or more aspects of the structure; a third set of machine-executable instructions for receiving a selection of at least one of the plurality of first product variable attributes from a user via the user interface; a fourth set of machine-executable instructions for in response to the user's selection of at least one of the plurality of first product variable attributes, determining, via the one or more computing devices, one or more second product variable attributes that are compatible with the selected at least one of the plurality of first product variable attributes and the at least one of the one or more aspects of the structure identified by the interrogating; and a fifth set of machine-executable instructions for indicating to the user, via the user interface, the one or more second product variable attributes.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 7 is a table illustrating an example of information that may be stored in a characteristic database like that of FIG. 2.

DETAILED DESCRIPTION

Aspects of the present disclosure include methods, systems, and software for optimizing product variables related to manufacture or supply of such products, which may be embodied in any of several ways. In some embodiments, various aspects of the methods, systems, and software disclosed herein may be included in a 3D computer modeling program, such as a CAD program. Additionally or alternatively, one or more of the methods, systems, and software disclosed herein may interact with a CAD product through an appropriate interface, such as an application program interface (API). Any code modules of the present disclosure that are integrated into an existing CAD product may be written in an applicable programming language for CAD products. A person of ordinary skill in the art will readily recognize that code sequences that work with CAD products through their APIs can be embodied in any computer programming language.

Herein, a "structure" (or the "product" that is designed) may be any object or part having a particular geometry. A 3D computer "model" may be a virtual representation of a structure and may be created using an appropriate CAD program and/or from image and/or video data. A "designer" or "user" may be the designer of a 3D computer model, a purchaser, an agent of the purchaser, a consumer, a home user, or a customer, among others. Examples of a structure include a piece of sheet metal, a solid cube, a cylindrical pipe, an injection molded plastic toy, an article of clothing such as a shirt made of cotton, and an assembly of various parts such as a motor vehicle, among others. A design may refer to a 3D computer model of a part or an assembly of 3D computer models of parts that may be a virtual representation of a particular structure and may be created using one or more appropriate CAD programs. Notably, while the present disclosure makes reference to 3D computer models for sheet metal products, aspects of the present disclosure can be applied to other types of products such as machined parts, 3D printed parts, discrete parts, and assemblies of parts, among others, as will be apparent to those of ordinary skill in the art after reading this disclosure in its entirety.

Figure 1:
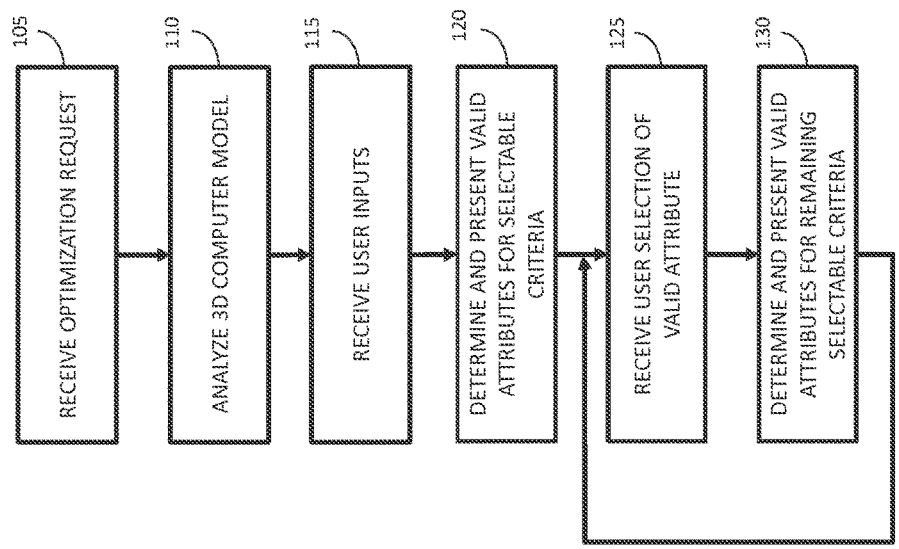
FIG. 1 is a high level flowchart illustrating an exemplary method of assisting a user with specifying design attributes for a structure defined in a 3D computer model.

FIG. 1 provides a high level flowchart of the operation of a first embodiment of the present disclosure. While various embodiments of the present disclosure will be described in further detail below, this high level description is provided for ease of understanding. In step 105 one or more components of one or more systems such as those disclosed herein may receive a request from a user to optimize the selection of two or more interrelated attributes of variables for a given product design. "Variables" may refer to various aspects of the design or product and its manufacture (such as manufacturing process, material, tolerances, and finishing requirements such as plating, powder coating, among others) that can be selected for optimizing the cost/quality/lead-time tradeoffs of the manufactured product for the particular business opportunity being pursued. "Attributes" may refer to specific options for or types related to a particular variable. For example, the variable "material" might have associated "attributes" such as aluminum 5052-H32, aluminum 6061-T6, stainless steel, acetal, etc. A "request" may be a direct request for manufacturing optimization or part of another request such as a pricing request.

In step 110, a 3D computer model of a design may be analyzed to determine aspects of the modeled design (such as the weight, volume, material thickness, uniform or non-uniform material thickness, etc.) that may determine whether specific variable attributes can be utilized to manufacture the product in question. For example, if the 3D computer model or information that can be interrogated therefrom (as described further herein) indicates that the walls of the product will not be of uniform thickness, certain processes may not be available attributes for a "process" variable. It is to be understood that some 3D computer models do not provide sufficient information to determine eligibility of one or more variables; for those, this step 110 may be omitted. Other 3D computer models may provide such information, but the information may not alter the eligibility of any of the variable attributes available.

At step 115, a GUI may be presented to a user that provides an option to input other information (referred to as "constraints") that can be used in the selection of variable attributes (such as desired quantity of product). In some embodiments, this step may take place before step 110. At step 120, as will be described in more detail below, an interface may present attributes of first variables that are applicable to the design in question to the user. The listed variable attributes may be determined as a result of a comparison between the design data (as applicable), the variable attributes available from one or more suppliers, and/or any user constraints (e.g., requesting a particular quantity of product). Additionally or alternatively, variable attributes can be provided by third party standard setting bodies or other industry-recognized sources of such information.

At step 125, the user may select a particular attribute of the first variable, and in response in step 130 a user interface may present selected attributes of the second variable that are applicable to the 3D computer model as a function of the first variable attribute selected by the user and optionally as a function of information contained in or derived from (e.g., via an automated interrogator) the 3D computer model itself. The process may then return to step 125 to enable the user to select from amongst other variables should the user desire to do so, and the process may continue until the user has finished making selections.

Figure 2:
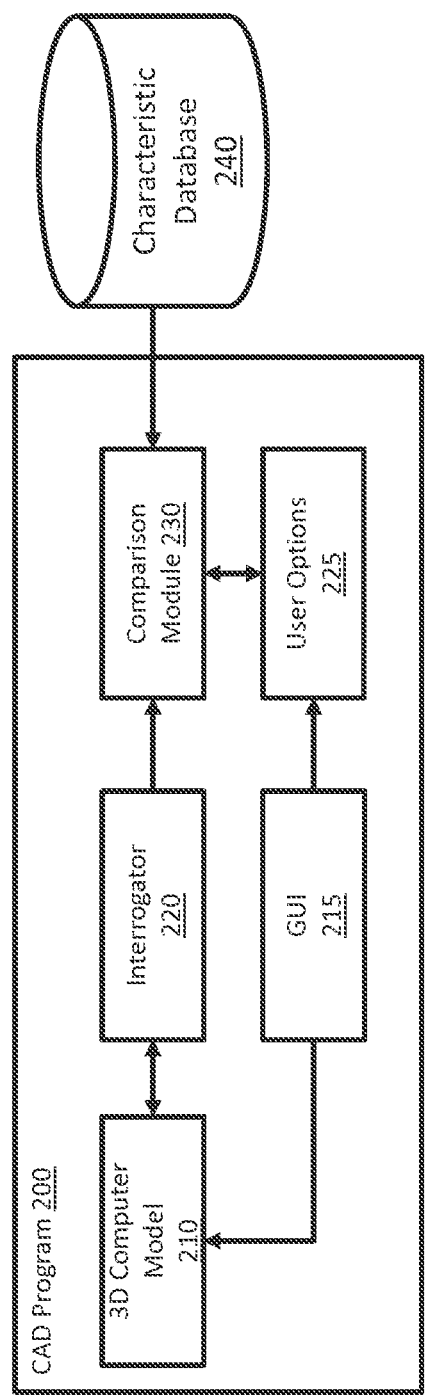
FIG. 2 is a block diagram of a computer control system that can be used to implement the method of FIG. 1.

With reference now to FIG. 2, a block diagram of a system of the present disclosure is shown, various portions of which may be implemented in software. In the description to follow, reference is made to "blocks" of computer program code, or modules of code. It is to be understood that the reference to separate "modules" is for ease of illustration and discussion. As a practical matter, the program code instantiating aspects of the present disclosure could be organized in any of a number of well-known manners to provide the functions described. While it is possible that separate code modules could be created to achieve the separate functions described, that is not required. So while various modules of software of the present disclosure are described separately, in practice the actual modules of code instantiating the functions described for those separate modules could be intermingled; they do not have to be separate and independent sequences of code.

As shown in FIG. 2, a system usable to implement one or more aspects of the present disclosure may include a CAD program 200, a characteristic database 240, and a comparison module 230. In the CAD program 200, user inputs and screen displays to enable those inputs may be provided by a GUI 215. In practice, the GUI may be associated with a computer through which the user is controlling the CAD program 200. However, in some embodiments the GUI 215 may be hosted by any computer system that can receive user inputs, ranging from a cellphone up to a server system. The CAD program 200 may include functionality of 3D CAD programs known in the prior art usable to create a 3D computer model 210 of a product design. The CAD program 200 may also include a user options module 225, which may read user inputs from GUI 215 to provide user constraints (such as requested quantity) or other data, dictate the presented product attributes, and/or monitor user selections of presented attributes. Notably, although various portions of the present disclosure include reference to various portions of the system shown in FIG. 2, that system is only one example of a system that can implement functionalities of the present disclosure. For example, in some embodiments, an Interrogator 220, comparison module 230, GUI 215, and/or user options 225 may be provided separately from any 3D computer models or CAD program. Similarly, a CAD program may be provided without any interrogator or comparison module, among other components, as these may be located and/or accessed via a remote server or cloud application. Various other alternative implementations will become apparent to those of ordinary skill in the art after reading this disclosure in its entirety.

Characteristic database 240 may be any database product that can provide the organization of information set forth below. In an embodiment, as will be described in more detail below, the database 240 may include supplier parameter data that sets forth relationships between given processes and eligible materials, optionally as well as minimum and maximum sizes for finished workpieces (in three dimensions), for a finished flat size, and/or for minimum and maximum thicknesses of materials to be used in construction of a product embodying a CAD design. Database 240 may also include non-numeric data regarding one or more suppliers' ability to provide a desired product attribute, such as a certain level of polishing or surface finish. In an embodiment, this information may be provided by one or more suppliers as part of the initial or continuing configuration of the system; in some embodiments, the information could be provided on demand during operation of one or more systems of the present disclosure. Database 240 may also include information such as name and location of the supplier(s); data from which supplier prices may be calculated by the pricing module discussed below (such as one or more labor costs, set-up costs, shipping costs, and/or other supplier pricing data) or overall prices associated with specific products, specific processes, or specified product components; as well as other information reflecting the manufacturing capabilities of the supplier(s), such as polishing/surface finishing options. Notably, although aspects of the present disclosure are described below with reference to data from a single supplier, the teachings of aspects of the present disclosure can be applied to data from multiple suppliers. In this regard, reference is made to the following applications, which are incorporated by reference herein for their teachings of selecting amongst multiple suppliers: U.S. Patent Application Ser. No. 62/073,481, filed on Oct. 31, 2014, and titled "Automated Correlation of Modeled Product and Preferred Manufacturers"; and U.S. Patent Application Ser. No. 62/073,516, filed on Oct. 31, 2014, and titled "Automated Correlation of Modeled Product and Preferred Component Manufacturers".

The CAD program 200 may also include an Interrogator 220, and in addition may include a pricing module (not shown, but discussed further below). Interrogator 220 may interrogate, or parse, the data from the 3D computer model 210 to identify design attributes, components, processes, or other aspects of the 3D computer model that can be used by the comparison module 230. By way of example, Interrogator 220 may determine the overall length, width, and height of the product to be manufactured, as well as the size and thickness of the sheet of material that will be required as a starting point for manufacture of the product. Aspects of the present disclosure may also include a pricing module, which may receive the output of interrogator 220 to obtain required unit prices from or related to a supplier to estimate the total price of the manufactured product. Illustrative embodiments for such Interrogator 220, as well as an associated pricing module, may be found in: U.S. patent application Ser. No. 14/060,033, filed on Oct. 22, 2013, and entitled "AUTOMATED FABRICATION PRICE QUOTING AND FABRICATION ORDERING FOR COMPUTER-MODELED STRUCTURES", which is incorporated by reference herein for its teachings of extracting pricing data from computer models; U.S. patent application Ser. No. 14/282,773, filed on May 20, 2014, and entitled "METHODS AND SOFTWARE FOR ENABLING CUSTOM PRICING IN AN ELECTRONIC COMMERCE SYSTEM", which is incorporated by reference herein for its teachings of particular interrogator engines; and U.S. Patent Application Ser. No. 62/072,653, filed on Oct. 30, 2014, and titled "METHODS AND SOFTWARE FOR FACILITATING PRICING AND ORDERING OF A STRUCTURE REPRESENTED IN A COMPUTER MODEL", which is incorporated by reference herein for its teachings of various interrogation engines and related functionality.

In some embodiments, an interrogator, such as Interrogator 220, may parse and/or analyze a 3D computer model to identify separate elements thereof by reading a combination of (a) specific commands issued by a CAD system and (b) specific routines or functions associated with such commands to determine whether they collectively define an individual element or portion (a "shape," "solid body," or "component") of a 3D computer model. Many CAD systems, including, by way of example, SolidWorks® (registered trademark of Dassault Systemes), include an application program interface (API) to enable a user to control the issuance of customized routines or functions associated with such commands. Interrogator 220 may read such commands, routines, and functions to determine whether they define an individual shape, and, if so, may analyze various geometric aspects of the defined shape to determine whether such aspects correspond to one or more manufacturing requirements for a product to be manufactured based on a 3D computer model. If so, such requirements may be output from Interrogator 220 as CAD data or interrogation data for processing and analysis by any one or more components of the present disclosure.

As a first step, Interrogator 220 may identify discrete shapes in a 3D computer model. In an embodiment based on the SolidWorks CAD program, Interrogator 220 may read the "FeatureManager Design Tree" (an outline representation of individual shapes) to determine the number of solid bodies (or shapes) in the design. Representations of individual shapes may be found in other CAD software files, and other CAD software systems may be used. In SolidWorks, one command usable to analyze the number of solid bodies is:

object[ ] bodies=(object[ ])part.GetBodies2((int)Const.swBodyType_e.swSolidBody, false);

and the output is a list of bodies. The foregoing code statement is listed by way of example only; other code statements or sequences could be used.

Interrogator 220 may then analyze geometric aspects of such identified shapes and compare such aspects to corresponding manufacturing requirements. In an embodiment, these manufacturing requirements may include given starting materials. In other words, Interrogator 220 may determine whether a given defined shape can be manufactured from a given starting material, based on one or more analyzed geometric properties of one or more identified shapes. If so, that starting material may be identified as a manufacturing requirement and may be included in CAD data generated by Interrogator 220. As a result, a pricing module may read prices associated with such starting materials from a supplier database or other location to determine a given supplier's calculated price per unit for a product to be manufactured in accordance with such 3D computer model.

In an embodiment, Interrogator 220 may determine whether a defined shape may be manufactured from a sheet metal part. In general, in order to be manufactured from sheet metal, a defined shape must have a uniform thickness. As will be apparent to a person of skill in the art after reading this disclosure in its entirety, other geometric attributes may be analyzed to determine potential manufacturing requirements. By way of example, a given angle of bend may preclude use of certain starting materials. A given dimensional measurement may preclude certain starting materials. In an alternate embodiment, different geometric properties may be compared in combination to define manufacturing requirements. For example, a given shape may have a uniform thickness (such that it could be manufactured from two different types of sheet metal, such as copper or aluminum), be 0.50″ thick, and include bends of over 45 degrees (which may preclude the use of a copper sheet, because various types of copper, depending, on composition, may not be bendable at 45 degrees at a 0.50″ thickness).

In some embodiments, in order to determine whether a given shape has a uniform thickness, Interrogator 220 may first execute the "GetBoundingBox" SolidWorks API command. The resulting output may be an array of X, Y and Z extents, for example:

XCorner1, YCorner1, ZCorner1
XCorner2, YCorner2, ZCorner2

In some embodiments, a part may not be oriented so that its thickness is represented by the Z dimension (i.e., the part is lying flat) but instead by a X or Y dimension. This may be the case where an interrogator needs to determine whether sheet metal can be used to fabricate the part. However, if Interrogator 220 analyzes the x,y plane, then it may not be able to reliably identify each portion of the part that can be fabricated from sheet metal; by also analyzing the z dimension, the interrogator may reliably identify all sheet metal parts. Interrogator 220 may determine which dimension represents thickness by determining distance between corners. Thickness may be represented by the shortest distance, as follows:

$$abs[XCorner1-XCorner2]=\text{Variable } X$$

$$abs[YCorner1-YCorner2]=\text{Variable } Y$$

$$abs[ZCorner1-ZCorner2]=\text{Variable } Z$$

For this example, if Variable X has the lowest value of the three results, it may represent the thickness of a 3D computer model. If that is the case, width and length of the 3D computer model may then be calculated as $$\text{Width}=abs[YCorner1-YCorner2]$$

$$\text{Length}=abs[ZCorner1-ZCorner2]$$

Given these calculations, interrogator 220 may determine that a workpiece has a uniform thickness if all of the following statements are true: the 3D computer model must have at least one solid body; all of the vertexes of the solid body faces that are perpendicular to the base plane are also equal to the thickness value (Variable X in this example); no vertex edge length is less than the thickness value; and the perimeter of the top face is equal to the perimeter of the bottom face. This may be determined through the following code, which finds the perimeter for each face. The values of the faces are then compared and if they are equal, the output is true.

```
double getPerimeter(IFace2 face)
{
var edges=face.GetEdges( ) as object[ ];
double perimeter=0;
foreach (IEdge edge in edges)
if (edge !=null)
perimeter+=edge.GetLength(SwApp);
return perimeter;
}
```

The foregoing code statements are listed by way of example only; other code statements or sequences could be used. If the results are all true, the analyzed shape of the 3D computer model may represent a workpiece of uniform thickness. As such, Interrogator 220 may conclude that the analyzed shape may be fabricated from a single sheet metal part. Accordingly, by way of example, "sheet metal" may be included in CAD data as a manufacturing requirement, which may cause a pricing module to read prices for sheet metal parts (versus prices for plastics or other materials) from a supplier database or elsewhere. As a result, a pricing module may determine a given supplier's calculated price per unit for a product to be manufactured in accordance with such manufacturing constraints as automatedly determined by Interrogator 220.

The "uniform thickness" determination set forth above, as well as the attendant height, length, and thickness measurements, may be used to enable other comparisons between manufacturing requirements and supplier attributes. For example, once the use of a sheet metal workpiece has been confirmed as set forth above, a capabilities engine may query stored supplier data for any one of length, width, thickness, or any other supplier constraints for sheet metal parts. An example of a potential supplier constraint that would be determined by the nature of the starting workpiece material is as follows. For mechanical hole punching for sheet metal parts, a press brake may form predetermined bends in a workpiece by clamping it between a matching punch and a die. A press brake may include a bed for supporting the workpiece between the punch and the die. However, press brakes cannot typically bend parts longer than the length of the bed. If a given supplier uses a press brake having a maximum bed length of eight feet, utilizing the process as set forth above, Interrogator 220 may determine that a defined shape of a 3D computer model has a length of ten feet. In this case, a pricing module may not calculate pricing for that supplier because that supplier is unable to meet one of the manufacturing requirements imposed by the 3D computer model. Comparison module 230 may use outputs from Interrogator 220 to determine a price and/or to determine whether various processes and/or materials are compatible with one another and/or one or more 3D computer models, as described herein.

3D computer models typically contain a plethora of data but do not store the data in such a way that pricing information can be derived directly therefrom. To cure this deficiency, Interrogator 220 may pull data (e.g., material type) from the 3D computer model and may provide it to a comparison module or pricing engine, reformat the data for the comparison and/or a pricing module, and/or provide the reformatted data and/or interpret the data into new data specifically for a comparison and/or pricing module and provide the new data to the comparison and/or pricing module.

Interpreting data into new data may involve one or more of any number of functions and/or operations. For example, for a sheet metal part, a 3D computer model may include a variety of information regarding a bend. However, it may be useful for the comparison module 230, or a pricing module, to have access to information specifying how many unique bends there are with different bend lengths and the quantity of bends for each unique bend length. To determine such information, Interrogator 220 may query one or more bends in the 3D computer model, establish a table of bend lengths, and determine a sum of bend lengths, for example, for each bend of a common bend length.

Another sheet metal example is "Hole Too Close To An Edge" (HOLE). CAD programs and 3D computer models typically do not store this information in the 3D computer model. However, a HOLE can cause manufacturing issues (e.g., it can deform surrounding material and, in the case of a diameter, the hole may become oblong) if it is, for example, less than four times the material thickness away from the bend. Therefore Interrogator 220 may verify the distance from one or more holes to the closest respective bend, divide that distance by the material thickness, and set a true/false flag as a function of the result.

Yet another sheet metal example is that the length of a punched hole diameter typically needs to be equal to or greater than the material thickness. If it is not, a second operation may be required to manufacture the hole, resulting in more time spent to create the hole than if it could simply be punched. Interrogator 220 may check for this situation and set a true/false flag depending upon the result.

A generic example that would be relevant to such processes as sheet metal, machining, and injection molding is whether a hole extends through a part or only extends partially into the part. The result may affect manufacturing costs, as, for example, a non-through hole in sheet metal requires another operation (e.g., machining) to create the hole. CAD programs and 3D computer models may not specify whether or not a hole extends through associated material. In some CAD programs, given a sheet with a thickness, to put a hole in the sheet, a user may create a cylinder and define one or more Boolean operations to subtract the cylinder from the sheet; under these conditions, there may not be any explicit information in the 3D computer model regarding whether the hole extends through the sheet. In this case, Interrogator 220 can be programmed to analyze the maximum material thickness for the hole or directly proximal thereto, compare that thickness to the geometry modeled to cut the hole, and set a true/false flag that may be utilized by the comparison module 230 (or a pricing module, in determining a price).

Figure 3:
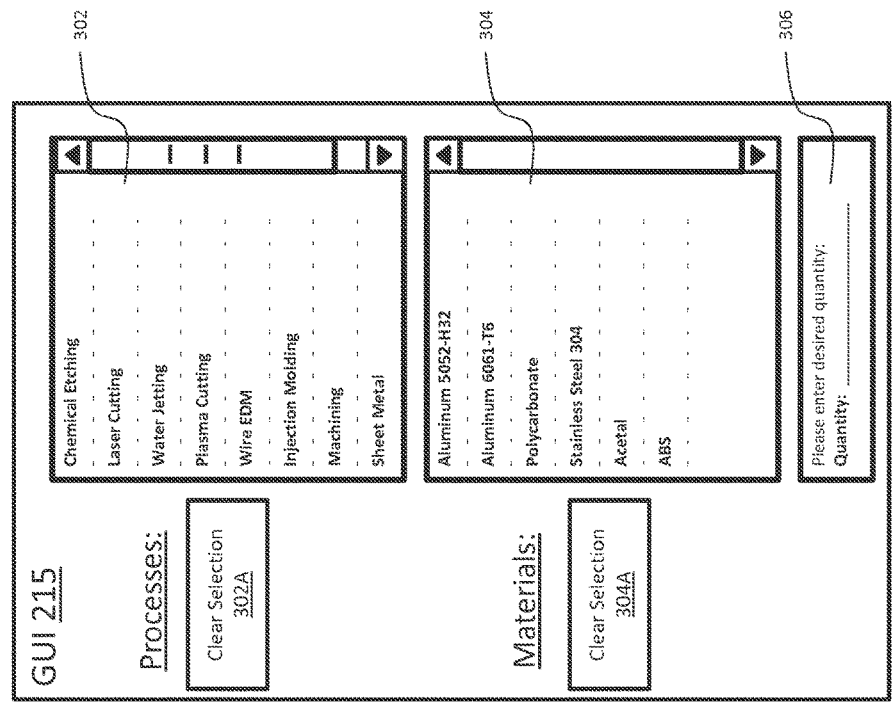
FIGS. 3, 4, 5A-5B, and 6 are representative screenshots of a user interface illustrating exemplary capabilities and sequences of selection.

FIG. 3 is an example of information that may be displayed via GUI 215 at step 115 of the method of FIG. 1 after an optimization request has been received. As shown, an interface may list a variety of standard process options 302 for a variable such as "processes" (such as chemical etching, laser cutting, etc.) and a variety of standard materials options 304 for a variable such as "material" (such as particular types of aluminum, polycarbonate, etc.). As will be readily understood by a person of ordinary skill in the art after reading this disclosure in its entirety, these listings of process options and material options are only examples; other processes and materials and/or other variables of product design and/or manufacturing may be used. The GUI 215 may also provide an option 306 for the user to indicate a particular constraint, such as a total quantity of product requested, which may be associated with a standard lead time (not shown here for ease of illustration). It is to be understood that other user inputs could be provided as well, such as preferred maximum price. As previously discussed, these user inputs may be provided at step 115 of FIG. 1 via GUI 215 to the user options module 225 (which may record and/or display selection of such options), which may then provide the inputs to the comparison module 230 of FIG. 2. Note also that the GUI 215 may include icons 302A, 304A to enable the user to clear one or more of their selections 302, 304 respectively.

Figure 4:
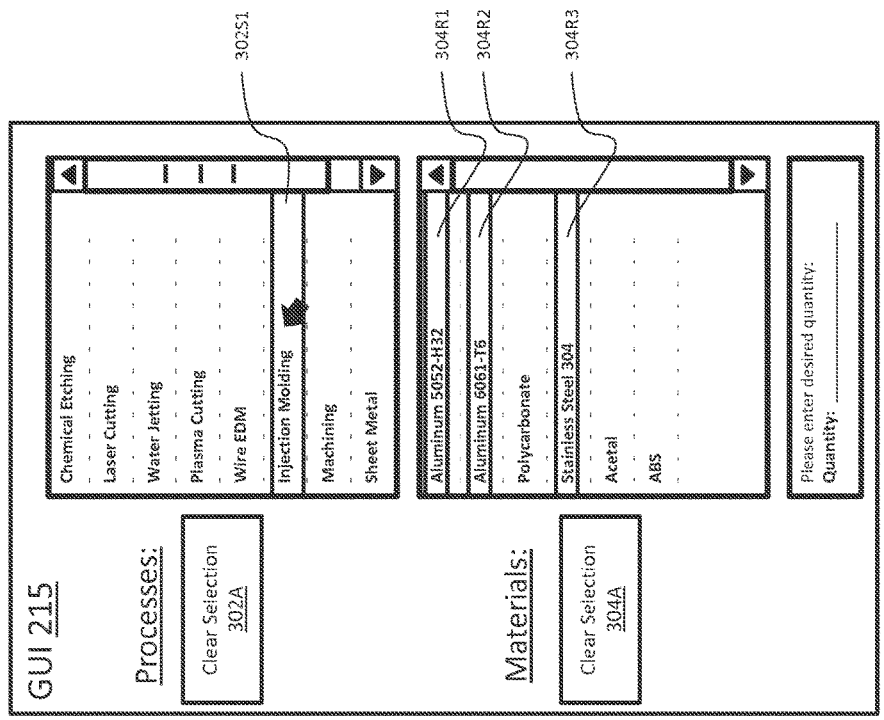

FIG. 4 is an example of information that may be displayed via GUI 215 at step 125 of FIG. 1. As indicated by the cursor/arrow, in this particular example the user has selected a particular attribute, in this case an injection molding process 302S1. As a result, comparison module 230 may compare this process to user options 225, characteristic database 240, and/or elements of 3D computer model 210 or information derived therefrom to determine whether any particular materials may be incompatible with injection molding. In this example, comparison module 230 eliminates the metal-based materials (the aluminum options 304R1 and 304R2, as well as the stainless steel 304R3) from further consideration or use, optionally by "graying out" those options, marking them with an icon indicating incompatibility or a warning, or simply eliminating them from the display, because metal materials are typically not compatible with or useful in standard injection molding processes under conventional manufacturing operations. As noted, this "elimination from further consideration" may be indicated by these options being "grayed out" or shaded, although other indications and/or mechanisms could be used. As will be clear to a person of ordinary skill in the art after reading this disclosure in its entirety, a variety of methods could be employed to graphically indicate the difference between options that can still be used and options that are no longer available or not recommended, such as changing the color of the font of ineligible options and/or highlighting eligible options, among others. As will also be clear to a person of skill in the art after reading this disclosure in its entirety, under the right conditions (e.g., high temperature processes) aluminum can be used in an injection molding process; however, under usual conditions it is only plastic or organic based materials (such as those that remain eligible in this particular example) that would usually be employed in standard injection molding processes. Not shown is the final selection of the material by the user from the now available options of polycarbonate, acetal, and acrylonitrile butadiene styrene (ABS).

In some embodiments, "eligible options" can be fine-tuned for different industries or expected operating conditions. For example, if the product being designed is one that will be required to withstand extremely high temperatures, a user may specify that requirement via GUI 215 to user options 225 and comparison module 230 may compare that requirement with various standard options and determine that injection molding should not be listed as an available process or should otherwise be indicated as incompatible with specified user options. In some embodiments, an option deemed incompatible by comparison module 230 may still be selectable by a user, although selection of such an incompatible option may cause the comparison module to display one or more warnings, produce one or more audible warning sounds, and/or display a prompt asking the user to confirm whether they wish to proceed with a likely incompatible option. Enabling users to override compatibility options can enable users to order parts that are manufactured using materials or processes that may be automatedly determined to be compatible when, in fact, the user may know that the materials or processes are not incompatible at least for the purposes of their particular design. Additionally or alternatively, part of the user inputs can be special conditions or requirements that will in turn constrain or enlarge eligible options. For example, a user input could include "required temperature tolerance of 1,000 degrees Centigrade," which may cause comparison module 230 to eliminate standard injection molding as a process option and, for example, ABS as a material option on the user interface.

Figure 5A:
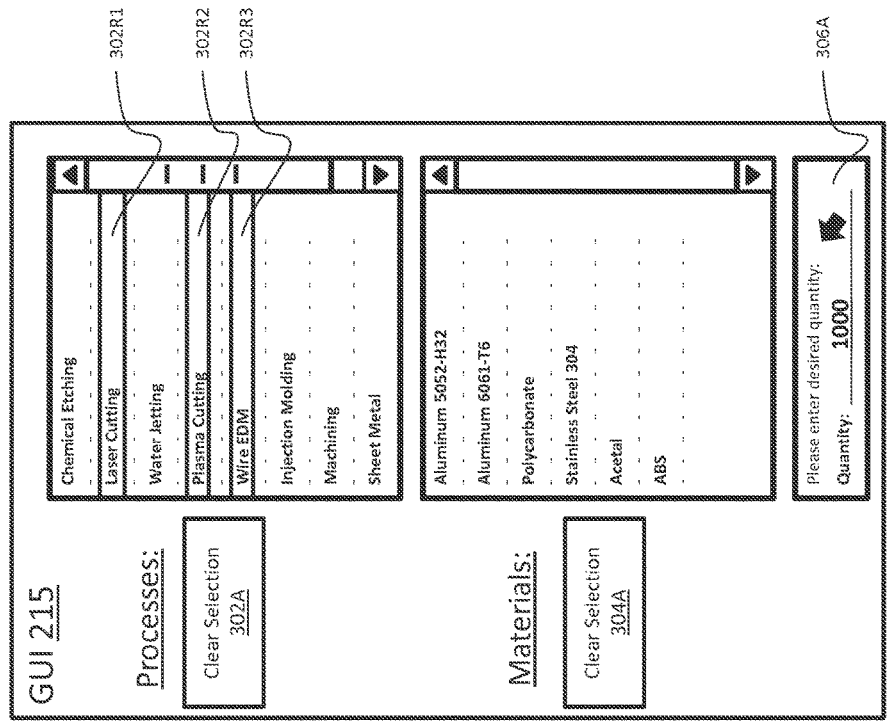
Figure 5B:
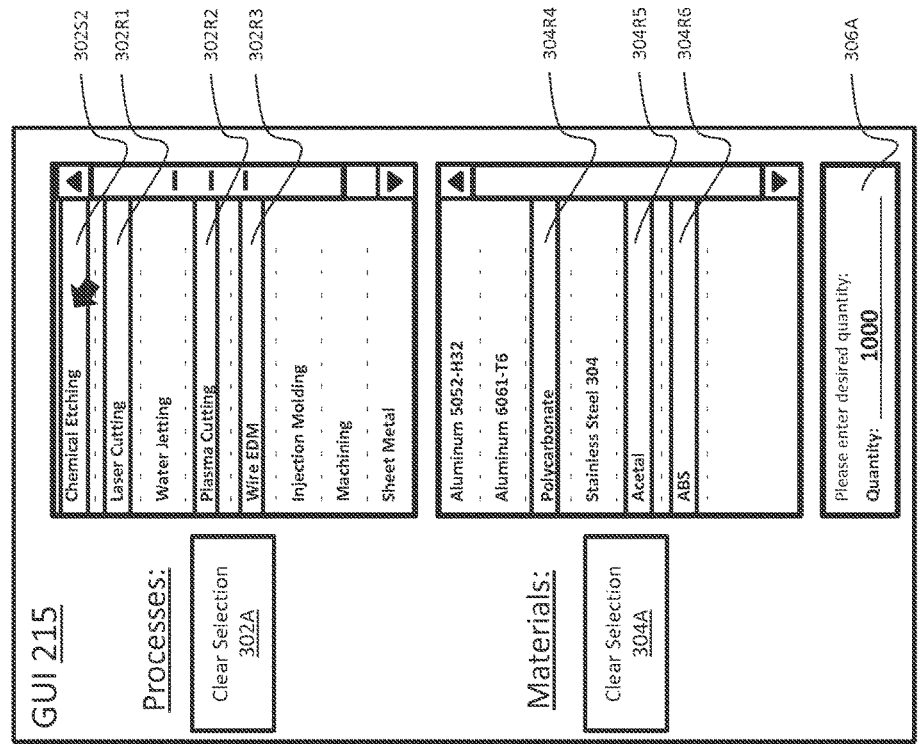

The above-described functionality will now be further explored with reference to FIGS. 5A and 5B. As shown in FIG. 5A, at 306A the user has indicated that they want to receive 1,000 units of product (which may be articulated as being expected within a standard lead time). In this case, comparison module 230 may eliminate laser cutting 302R1, plasma cutting 302R2, and wire EDM 302R3 as process options due to information in database 240 indicating these processes are not viable candidates to supply that volume of product within a generally accepted standard lead time. This may be due to generally known higher cost considerations or it may be due to bandwidth limitations in the processes themselves.

With reference to FIG. 5B, the user then selects from amongst the remaining process options, indicating (again as indicated by the arrow) that they wish to utilize a chemical etching process 302S2. That selection may cause the comparison module 230 to remove non-metal based substrates polycarbonate 304R4, acetal 304R5, and ABS 304R6 as eligible options, which may be indicated by shading, removed, or otherwise marked as being incompatible, as described above. Not shown is the resulting final selection of the material by the user from the now available options aluminum 5052-H32, aluminum 6061-T6, and stainless steel.

Figure 6:
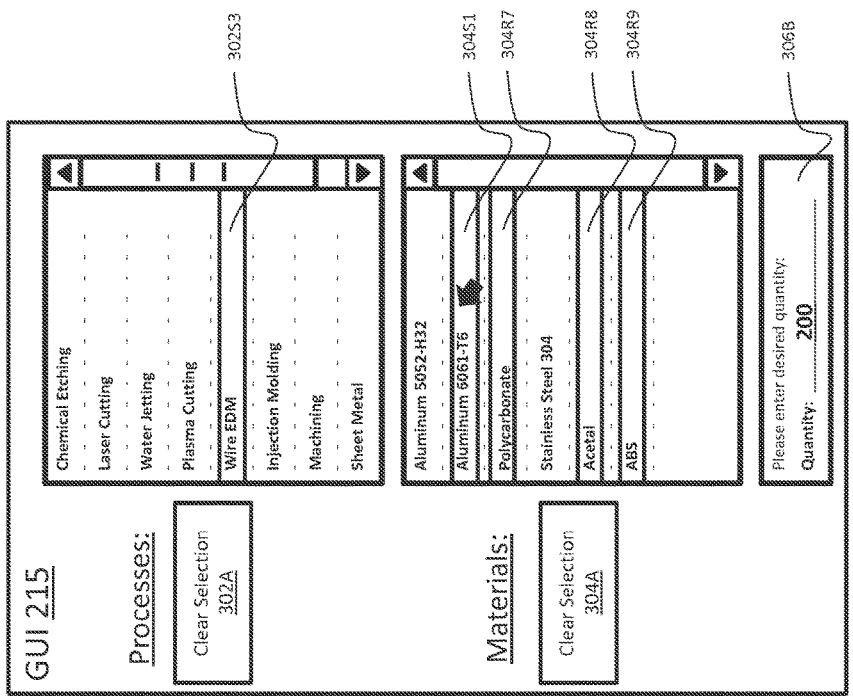

With reference to FIG. 6, another example of the operation of an embodiment of aspects of the present disclosure is illustrated. In this example, a quantity of 200 units 306B is input by the user at step 115 of FIG. 1. Given the low quantity, no processes 302 or materials 304 may be eliminated from further consideration such that the full list of options is presented to the user at step 120 of FIG. 1. The user may then select a particular process (wire electrical discharge machining (EDM) 302S3) at step 125 of FIG. 1, and as a result, materials 304R7, 304R8, and 304R9 may be removed from further consideration, with the rest remaining eligible for consideration and presented to the user at step 130 of FIG. 1. Then, as indicated by the arrow, a particular material (aluminum 6061-T6 304S1) is selected by the user from the remaining material options, per step 125 of FIG. 1.

In some embodiments, the user can select amongst materials to drive the elimination of particular processes. That is, in the embodiments above aspects of the present disclosure have been described with reference to user selections of particular processes (FIG. 4, FIG. 5B, FIG. 6) or particular quantities (FIG. 5A, FIG. 6) as controlling the material that can be used to manufacture the product design set forth in the 3D computer model 210. For example, in FIG. 6, when a material 304 is ultimately selected, that selection is subject to the previous selections of processes and/or other inputs that preceded selection of the material to be used. However, in some embodiments, a user may select a material from which they want a product fabricated, and comparison module 230 may then eliminate from further consideration, gray out, or otherwise indicate as compatible all processes that are incompatible with the selected material. So, for example, if an aluminum material is first selected by the user, the injection molding processes may be eliminated from further consideration.

FIG. 7 is a table illustrating exemplary data that may be stored by the characteristic database 240 for a process variable. This data may be used by the comparison module 230 in comparing the data from the supplier to data from the 3D computer model 210 as parsed by the Interrogator 220. As previously stated, while the information depicted is for a single supplier, the information could be for an aggregate of suppliers working together (e.g., Supplier A has tools that can support injection molding, Supplier B has tools that can support chemical etching) or multiple tables could be stored, for example, each for a different supplier. Further, some or all of the data of characteristic database 240 may be sourced from a standards setting body, a reference work, and/or other third party source of information independent of a given supplier. Depending upon how the data structure is set up, each variable might have its own table relating other variables to it as well as design attributes considerations.

The table in FIG. 7 includes a correlation between process 302 and respective materials 304. Note that each row on the table is a particular combination of a particular process 302 and a particular material 304. While particular examples are set forth, it will be clear to a person of skill in the art after reading this disclosure in its entirety that a wide variety of combinations of processes and materials may be used. Column 702 lists the required tolerance for each measurement listed in subsequent columns. Column 704 lists the total number of units that can be produced. In some embodiments, instead of that total maximum capacity being absolute, it can be expressed as total maximum of units per day, for example, for a standard lead time. In this example, the numbers listed are a daily maximum for a standard lead time (e.g., 8 weeks). Note that for row 720, the laser cutting operation only has a throughput of 750 units, which is why laser cutting was eliminated as an option in FIG. 5A when the user requested 1,000 units. Columns 706 and 708 set forth minimum and maximum volume (height, width, depth) for a product made pursuant to the specified combination of process and material. Note for example in comparing rows 722A to 722B, the same material AL-H32 can be processed into a much higher volume product by using waterjet cutting (row 722B, column 708) than using chemical etching (row 722A, column 708). Columns 710 and 712 set forth the minimum and maximum flat size (in length and width dimensions) of a single sheet of material subjected to the specified process. For example, again with reference to rows 722A and 722B, note that the same material AL-H32 can be processed into a much larger piece of flat metal by using waterjet cutting (row 722B, column 712) than using chemical etching (row 722A, column 712). Columns 714 and 716 set forth the minimum and maximum thicknesses of the materials that can be applied to the specified process in a given row.

In operation, the comparison module 230 may compare these minimums and maximums for given combinations of process and material with the specifications of the designed 3D computer model as indicated by Interrogator 220. For example, if the 3D computer model calls for the manufactured product to have a wall thickness of 1.0 inches, the laser cutting and chemical etching processes as used on aluminum would be eliminated from consideration at step 120 of FIG. 1, because the database 240 indicates that requirement exceeds the maximum thicknesses for those particular combinations of process and material, as indicted at column 716 for the first three rows of database 240. Similarly, if the 3D computer model called for a volume of 0.02×1.0×20.0 inches, all the injection molding options would be eliminated by comparison module 230 because that requirement is below the minimum thickness required for injection modeling, as indicated by column 706 for the last two rows of the data table 240. Note also that as some variable attributes are eliminated and others are selected by the user, the comparison module 230 may also include a pricing module that may utilize the resultant selected variable attributes to obtain a price or price quote from suppliers that can support such selected variable attributes. In some embodiments, CAD program 200 and/or one or more other components of a system used to implement aspects of the present disclosure may automatedly generate an order for one or more instantiations of a product as a function of one or more of the design variable attributes and the 3D computer model provided by a user. Further, if desired, such an order may be automatedly transmitted to one or more suppliers via CAD program 200 and appropriate networking interfaces and infrastructure.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
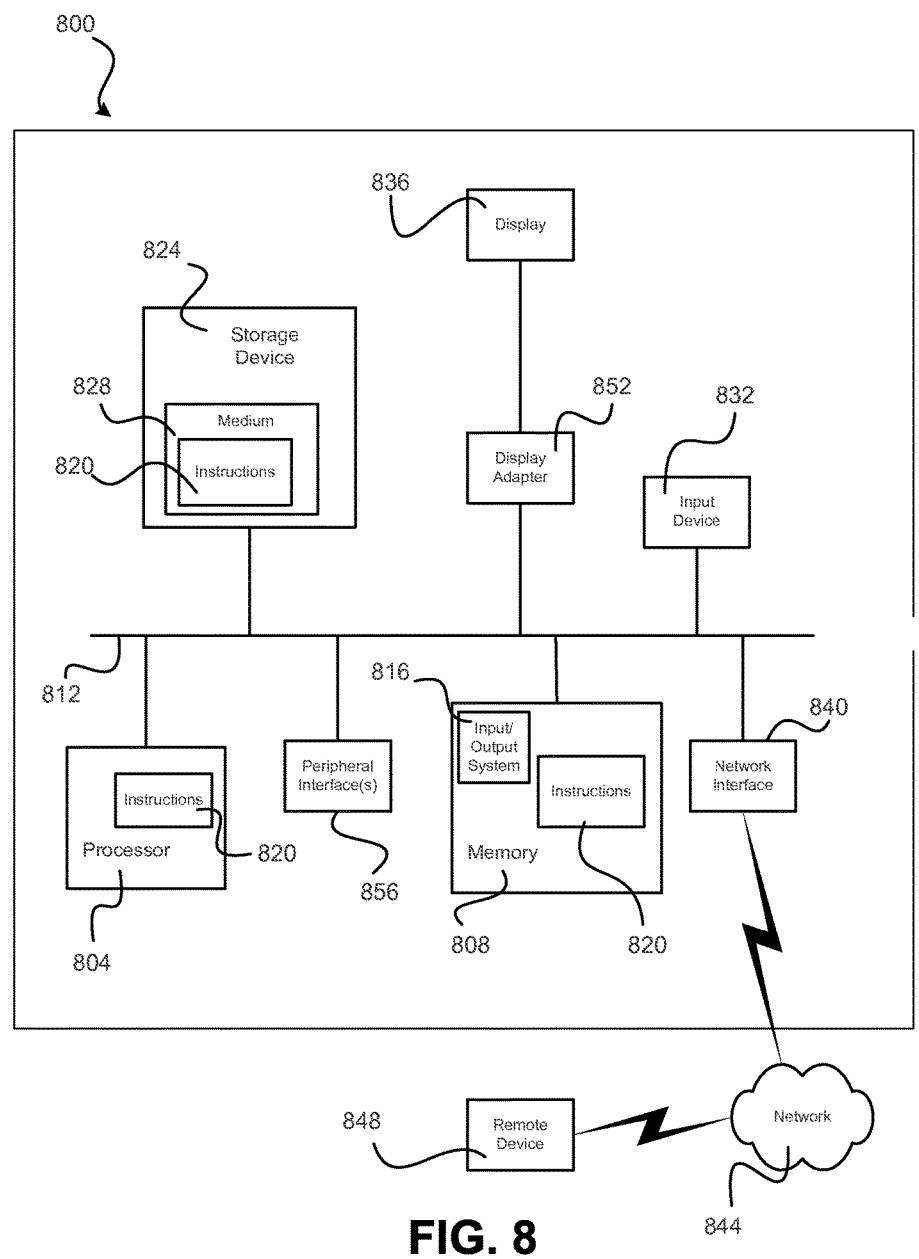
FIG. 8 is a block diagram view of a system that is controlled in accordance with an embodiment of the present disclosure.

FIG. 8 shows a diagrammatic representation of one embodiment of a computing device in the exemplary form of a computer system 800 within which a set of instructions for causing a control system, such as the system of FIG. 2, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine readable media) including, but not limited to, a random access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

In operation, the database 240 can be stored on a storage device associated with the computer of FIG. 8 (such as in storage device 824) or on storage devices that are the same as those of storage device 824, except on a remote device 848 accessed through the network 844 via the network interface 840. Alternatively, and as previously stated, aspects of the present disclosure can be implemented in a software-as-a-service through a cloud connection, in which case the user may enter user input data via a GUI 215 that is provided on a remote device 848, while the remaining portions of the software system as shown in FIG. 2 may be resident on the storage device 824 of a central (cloud) server 800, such that the inputs are supplied via network 844 and network interface 840 to a central server device 800, the inputs causing the processor to execute program instructions in accordance with aspects of the present disclosure, which may be resident in central storage 828.

The foregoing has been a detailed description of illustrative embodiments. Various modifications and additions can be made without departing from the spirit and scope of this disclosure. For example, the screen views of aspects of the present disclosure could be for an entire screen (such as shown in FIGS. 3-6) or they could be rendered along the side of, for example, a product ordering screen. While aspects of the present disclosure has been described with reference to particular process and product variables, other variables could be employed. Moreover, while aspects of the present disclosure has been described with reference to a CAD program and a CAD design, the principles of aspects of the present disclosure are applicable to other types of programs in which multiple variables may be applicable, including but not limited programs for enterprise resource planning (ERP), materials requirements planning (MRP), product lifecycle management (PLM), and customer relationship management (CRM) ordering systems. In other words, instead of being embedded in a CAD program, aspects of the present disclosure could be embedded in these other types of systems that manage production, such as the manufacture of apparel. Both sheet metal and apparel designers use CAD systems to design their products, using sheets of flat, material for manufacture. Design data, such as material choice, precise dimensions, or locations of additional features may be embedded within the digital design. Designers may choose different metals or fabrics (including non-woven materials such as leather) depending on the strength and other inherent properties of the material, which affects what manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance.

Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

What is claimed is:

1. A method of assisting a user with specifying product attributes for a structure defined in a 3D computer model of the structure to be manufactured via a computer-implemented user interface, the method performed by one or more computing devices and comprising:
presenting to the user, via the user interface, a plurality of first product variable attributes;
automatedly interrogating the 3D computer model, via the one or more computing devices, wherein interrogating further comprises:

identifying at least a discrete shape represented in the 3D computer model;

determining that the at least a discrete shape represents a shape to be manufactured; and retrieving, from a characteristics database, one or more aspects of the structure, wherein the one or more aspects further comprise at least a relation between the shape to be manufactured and a manufacturing method suitable for manufacturing the shape and at least a relation between the shape to be manufactured and a material suitable for manufacturing the shape; and retrieving, from the characteristics database, one or more product variable attributes associated with the one or more aspects of the structure;

receiving a selection of at least one of the plurality of first product variable attributes from the user via the user interface wherein the selection further comprises at least one of a selection of a material and a selection of a manufacturing method;

in response to the user's selection of the at least one of the plurality of first product variable attributes, determining, via the one or more computing devices, one or more second product variable attributes that are compatible with the selected at least one of the plurality of first product variable attributes and the at least one of the one or more aspects of the structure identified by said interrogating, wherein determining further comprises:

comparing the at least one of the plurality of first product variable attributes to the one or more product variable attributes associated with the one or more aspects of the structure; and selecting the one or more second product variable attributes from the one or more product variable attributes associated with the one or more aspects of the structure as a function of the comparison; and modifying the user interface as a function of the determination of the one or more second product variable attributes.

2. A method according to claim 1, wherein the first product variable comprises processes and the second product variable comprises materials.

3. A method according to claim 1, wherein the first product variable comprises materials and the second product variable comprises processes.

4. A method according to claim 1, further comprising:
comparing the one or more aspects of the structure with requirements for a plurality of initial product variable attributes to determine whether one or more of the plurality of initial product variable attributes are compatible with the one or more aspects of the structure; and
identifying the plurality of first product variable attributes as the initial product variable attributes determined to be compatible with the one or more aspects of the structure.

5. A method according to claim 1, further comprising:
receiving a constraint from the user;
determining, via the one or more computing devices, one or more first or second product variable attributes that are compatible with the constraint; and
indicating to the user the one or more first or second product variable attributes that are compatible with the constraint.

6. A method according to claim 5, wherein the constraint is a quantity of product.

7. A method according to claim 1, further comprising storing relationships between the plurality of first product variable attributes and the second product variable attributes in a database specifying related pairs of the selected ones of the plurality of first product variable attributes and second product variable attributes.

8. A method according to claim 1, further comprising receiving from the user a selection of a product variable attribute determined to be incompatible with the selected at least one of the plurality of first product variable attributes and the at least one of the one or more aspects of the structure identified by said interrogating.

9. A method according to claim 8, further comprising issuing one or more warnings to the user to indicate that an incompatible attribute has been selected.

10. A method according to claim 8, further comprising displaying a prompt requesting that the user confirm that they wish to proceed with an incompatible option.

11. A method according to claim 1, further comprising automatedly generating an order for one or more instantiations of a product as a function of one or more of the product variable attributes and the 3D computer model.

12. A method according to claim 11, further comprising automatedly transmitting the order to a supplier.

13. A machine-readable storage medium containing machine-executable instructions for performing method of assisting a user with specifying product attributes for a structure defined in a 3D computer model via a computer-implemented user interface, the machine-executable instructions comprising:

presenting to the user, via the user interface, a plurality of first product variable attributes;

automatedly interrogating the 3D computer model, via the one or more computing devices, determining that the at least a discrete shape represents a shape to be manufactured; and retrieving, from a characteristics database, one or more aspects of the structure, wherein the one or more aspects further comprise at least a relation between the shape to be manufactured and a manufacturing method suitable for manufacturing the shape and at least a relation between the shape to be manufactured and a material suitable for manufacturing the shape; and retrieving, from the characteristics database, one or more product variable attributes associated with the one or more aspects of the structure;

receiving a selection of at least one of the plurality of first product variable attributes from the user via the user interface wherein the selection further comprises at least one of a selection of material and a selection of a manufacturing method;

in response to the user's selection of the at least one of the plurality of first product variable attributes, determining, via the one or more computing devices, one or more second product variable attributes that are compatible with the selected at least one of the plurality of first product variable attributes and the at least one of the one or more aspects of the structure identified by said interrogating, wherein determining further comprises comparing the at least one of the plurality of first product variable attributes to the one or more product variable attributes associated with the one or more aspects of the structure and selecting the one or more second product variable attributes from the one or more product variable attributes associated with the one or more aspects of the structure as a function of the comparison; and modifying the user interface as a function of the determination of the one or more second product variable attributes.

14. A machine-readable storage medium according to claim 13, wherein the first product variable comprises processes and the second product variable comprises materials.

15. A machine-readable storage medium according to claim 13, wherein the first product variable comprises materials and the second product variable comprises processes.

16. A machine-readable storage medium according to claim 13, further comprising:
comparing the one or more aspects of the structure with requirements for a plurality of initial product variable attributes to determine whether one or more of the plurality of initial product variable attributes are compatible with the one or more aspects of the structure; and
identifying the plurality of first product variable attributes as the initial product variable attributes determined to be compatible with the one or more aspects of the structure.

17. A machine-readable storage medium according to claim 13, further comprising:
receiving a constraint from the user;
determining, via the one or more computing devices, one or more first or second product variable attributes that are compatible with the constraint; and
indicating to the user the one or more first or second product variable attributes that are compatible with the constraint.

18. A machine-readable storage medium according to claim 17, wherein the constraint is a quantity of product.

19. A machine-readable storage medium according to claim 13, further comprising
storing relationships between the plurality of first product variable attributes and the second product variable attributes in a database specifying related pairs of the selected ones of the plurality of first product variable attributes and second product variable attributes.

20. A machine-readable storage medium according to claim 13, further comprising receiving from the user a selection of a product variable attribute determined to be incompatible with the selected at least one of the plurality of first product variable attributes and the at least one of the one or more aspects of the structure identified by said interrogating.

* * * * *